(12) United States Patent
Englekirk (10) Patent No.: US 7,532,483 B2
(45) Date of Patent: May 12, 2009

(54) MOUNTING INTEGRATED CIRCUIT DIES FOR HIGH FREQUENCY SIGNAL ISOLATION

(75) Inventor: Robert Mark Englekirk, Pacific Palisades, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 464 days.

(21) Appl. No.: 11/451,624

(22) Filed: Jun. 12, 2006

(65) Prior Publication Data

US 2007/0284724 A1  Dec. 13, 2007

Related U.S. Application Data

(60) Provisional application No. 60/812,191, filed on Jun. 9, 2006.

(51) Int. Cl.
*H05K 7/10* (2006.01)
*H05K 7/12* (2006.01)

(52) U.S. Cl. .................. 361/767; 361/778; 361/792; 361/794

(58) Field of Classification Search ......... 361/770–776, 361/767, 792–795, 778, 782–785; 257/784–790, 257/690–692
See application file for complete search history.

(56) References Cited

U.S. PATENT DOCUMENTS 6,137,168 A * 10/2000 Kirkman ............... 257/691
6,770,963 B1 * 8/2004 Wu ....................... 257/691
7,250,673 B2 * 7/2007 Mangold ................ 257/691

OTHER PUBLICATIONS

Part 15 of the Federal Register, pp. 1, and 37-40, Jan. 26, 2005.

* cited by examiner

*Primary Examiner*—Tuan T Dinh
(74) *Attorney, Agent, or Firm*—Jaquez & Associates; Martin J. Jaquez, Esq.; William C. Boling, Esq.

(57) ABSTRACT

A method of connecting signal lines between an integrated circuit (IC) die and a carrier or external circuit, and corresponding apparatus. Techniques for adjusting magnetic coupling between terminated signal lines include splitting a return path for termination current and disposing one nearby on either side of the terminated signal line, creating two small termination current loops conducting in opposite directions; using separate terminating impedances, which may be unequal, to control current in each of the loops; and arranging major axes of the termination current loops for a signal to be perpendicular to those of the isolation-target signal. Capacitive coupling adjustments include routing ground potential termination current return connections nearby the signal connection to shield it from the isolated signal line, using dual overlapping connections to shield each return path, and adjusting dielectric material proximity to the signal paths. For isolation across a limited frequency range, increasing either inductive or capacitive mutual coupling above the achievable minimum may create an isolation null at the desired frequency that effects higher isolation than is obtainable with minimum coupling values.

20 Claims, 7 Drawing Sheets

MOUNTING INTEGRATED CIRCUIT DIES FOR HIGH FREQUENCY SIGNAL ISOLATION

CROSS REFERENCE TO RELATED APPLICATIONS

This application claims the benefit under 35 USC 119 of U.S. Provisional Application identified by, Application No. 60/812,191 filed Jun. 9, 2006 and entitled "Mounting Integrated Circuit Dies for High Frequency Signal Isolation" which is hereby incorporated herein in its entirety by reference.

BACKGROUND OF THE INVENTION

1. Field of the Invention

The disclosed methods and apparatus relate broadly to electronic integrated circuits ("ICs"), and more specifically to interfacing IC dies to circuits in which they are employed.

2. Related Art

Figure 1:
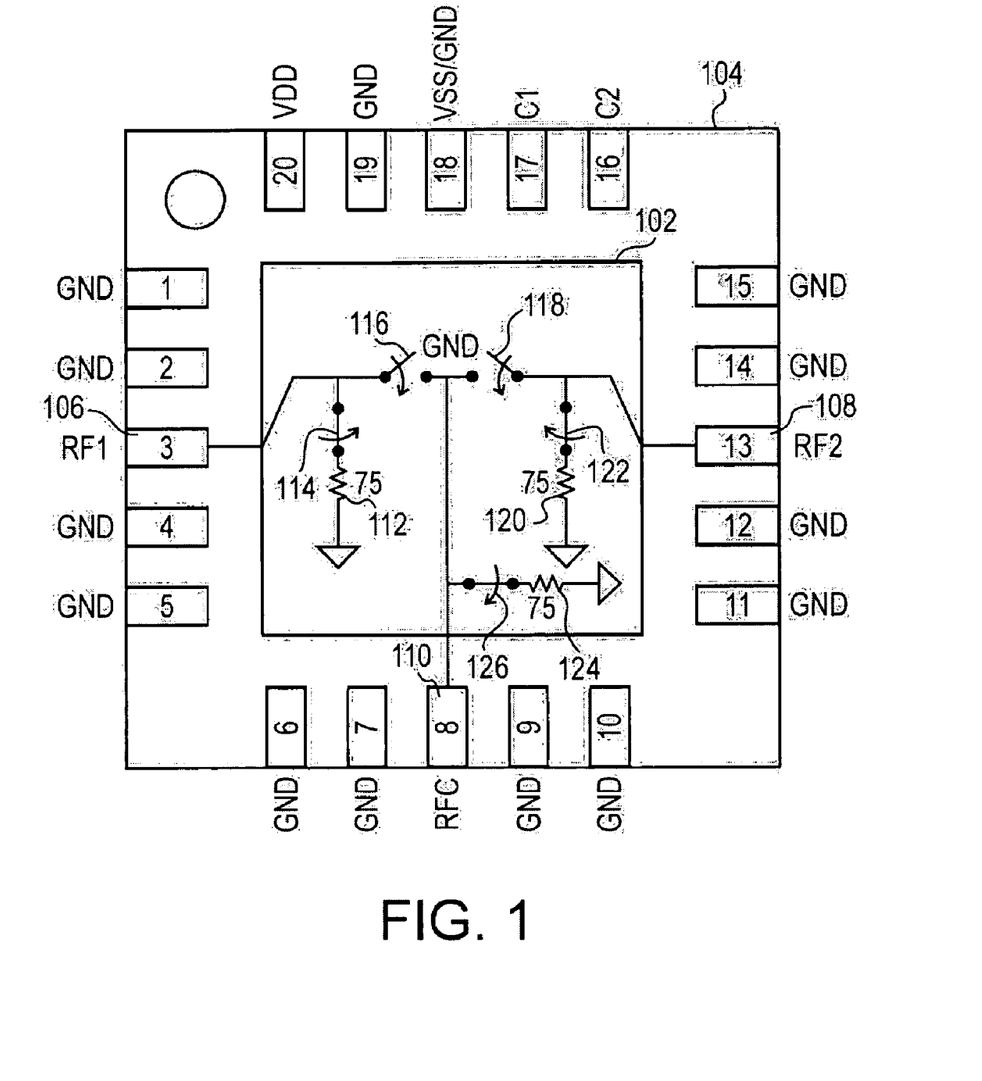
FIG. 1 is a simplified illustration of a high frequency analog switch integrated circuit disposed in a carrier package, with signal paths schematically represented.

ICs must generally be connected to external circuitry to be useful, and the interconnection itself may impact the net high frequency performance of the IC. For example, FIG. 1 illustrates an exemplary SPDT analog switching circuit. A first high frequency signal, RF1, is input to pin 3. A second high frequency signal, RF2, is input to pin 13. Control signals provided between pins 16 or 17 and 19 (GND) determine whether an RF common connection RFC is coupled to RF1 or to RF2. This particular exemplary analog switch provides switchable resistive termination into 75 ohms for any one of the three signal connections (RF1, RF2 or RFC) that is not otherwise properly terminated for RF signals.

An IC as shown in FIG. 1 may be employed in electronic devices that have stringent isolation requirements. Such requirements may derive from functional performance needs of the equipment employing the IC. Often, however, isolation requirements between terminals are defined by regulations that have little or nothing to do with adequate performance. Circuits such as the switch illustrated in FIG. 1 may be subject, for example, to the isolation requirements of FCC Part 15.115. These requirements include, among others, a requirement for isolation of −80 dB between any two of the signal lines RF1 and RF2 at a range of frequencies up to 216 MHz. Other regulations, and/or performance requirements, may establish correspondingly different isolation requirements.

An integrated circuit (IC) alone might satisfy such isolation requirements, yet fail when packaged in a carrier. A carrier typically provides a mounting and protection for an IC, together with terminals that are more readily connected to an external circuit than would be the connections, or pads, on the IC itself. Techniques by which the IC is protected and connected to the carrier may impair the inherent signal isolation provided by the IC alone. The interconnection techniques described herein help to satisfy both performance needs and regulatory requirements by minimizing the degradation of IC signal isolation that may be caused by mounting in a carrier.

SUMMARY

A method of connecting an IC connection pad of a signal line is provided for an integrated circuit ("IC") that includes a plurality of signal lines, each separately connectable to a common signal line, including a first signal line that is terminated to ground through a termination network when the first signal line is not connected to the common signal line. The method maintains high isolation of the terminated first signal line with respect to an isolation-target signal line by techniques that include splitting the signal line termination current so that it returns via a plurality of first signal return pads disposed on different sides of the first signal IC connection pad and separately connected to a common or ground connection on the carrier. The termination current thus divides between a plurality of first signal return paths, which creates opposing current loops to reduce inductive flux coupling to the isolation-target signal line (e.g., a second signal line, or the common signal line with respect to which high isolation is required). The area of the opposed termination current loops may be adjusted for best cancellation of magnetic flux with respect to the isolation-target signal connection. The return path connections (e.g., bond wires) from the first signal return pads may be connected to a ground plane of the carrier at corresponding plane connection points. Moreover, the current in the opposed current loops may be made unequal by employing different termination impedances for the different termination current loops.

The IC interconnection method may include, either alternatively or additionally, disposing conductors at a ground or AC common potential between the first signal line connection and the isolation-target signal line connections to reduce capacitive coupling. In the case where the return path connections from the first signal return pads are made to a carrier ground plane, this may include connecting the return conductors on the ground plane at points more distant from the IC die than a point of connection of a conductor from the ground plane to a corresponding carrier return terminal. Further, when two conductor wires are used for each return path, each may be connected to the carrier ground plane about as far from their other terminus as possible while remaining quite near the signal wire, so that they each provide ground potential shielding for the connection wire.

A method of configuring connections between a signal switching integrated circuit (IC) die and external circuit terminals is also disclosed. The signal lines include a first signal line, a first signal termination return line, an isolation-target signal line, and an isolation-target termination return line. The method enhances isolation between the first signal line and the isolation-target signal line at a particular frequency when the first signal line is terminated by a terminating impedance coupled between the first signal line and a corresponding termination current return connection. For each of the first signal line and the isolation-target signal line, this method includes splitting the return termination current so that it is conducted via a plurality of return current paths that are established adjacent to and on opposite sides of a path connecting the corresponding signal line between the IC die and the external terminal. The method further includes adjusting capacitive coupling between the first signal line and the isolation target signal line in accordance with any technique as described in more detail below; and adjusting magnetic coupling between the first signal connection and the isolation target signal connection in accordance with any technique described in more detail below, such that the mutual capacitive and magnetic couplings interact to provide an isolation between the signal lines that is higher, at a target frequency subject to stringent isolation requirements, than would be due to either the mutual capacitive coupling alone or the mutual magnetic coupling alone at such target frequency. Each method set forth hereinbelow for changing mutual capacitive coupling between the signal lines, and each method set forth for changing mutual magnetic coupling between the signal lines, and each functional combination of such method, is combined with the configuring method set forth above to create a different embodiment of this method.

Additional aspects include any apparatus that a skilled person would understand, in view of the description set forth below, as being configurable to implement any of the methods described above.

BRIEF DESCRIPTION OF THE DRAWINGS

Embodiments of the present invention will be more readily understood by reference to the following figures, in which like reference numbers and designations indicate like elements.

DETAILED DESCRIPTION

FIG. 1 illustrates, in a simplified quasi-schematic manner, signal switching functionality for an exemplary integrated circuit (IC) die 102 that is mounted on an IC package or carrier 104. The carrier 104 includes terminals used for connecting the IC to a circuit in which it is employed. In particular, a first RF signal will be connected to a terminal 106 that is labeled "RF1" and indicated as pin "3." A second RF signal will be connected to a terminal 108 (RF2, 13). An RF common will be connected to a terminal 110 (RFC, 8).

Each of the RF signal terminals is connected to the IC die 102, which includes switches to connect the signal to either an RF common, or to a termination path. The first RF signal, for example, is typically coupled to a terminating impedance 112 (here, 75 ohms resistive) via a first signal termination switch 114 when a first signal switch 116 is open (so that the signal is not terminated by another circuit). The second RF signal is shown similarly disconnected from other circuitry by an open second signal switch 118, and accordingly is connected to a terminating impedance 120 via a second signal terminating switch 122.

Because the RF common signal is not connected to either the first or second RF signals, the RF common signal is generally therefore connected to a terminating impedance 124 via a common termination switch 126, as shown. When either of the RF signals is connected to the RF common, the corresponding RF signal termination switch is typically opened. 75 ohm resistive terminating impedances are shown in this example, but the impedance may be set to any appropriate value. The terminating impedance will typically be set to the expected characteristic impedance of the transmission lines that connect the various RF signals to the IC.

Figure 2A:
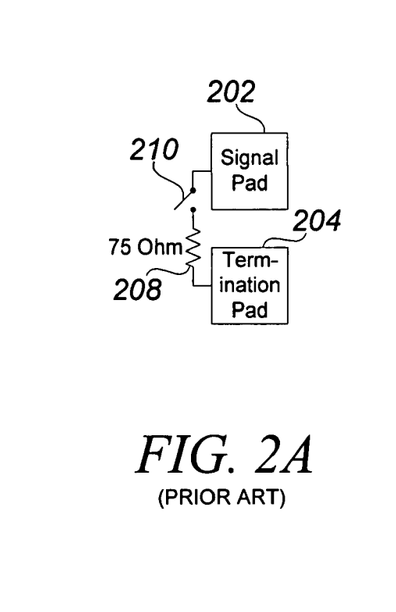
FIGS. 2A, 2B, 2C and 2D schematically represent termination current path configurations; 2A is prior art, while 2B, 2C and 2D show alternative configurations.

FIGS. 2A-2D illustrate various circuit configurations by which a termination path, including appropriate terminating impedance elements, may be coupled between a signal pad 202 of the IC die (e.g., the IC pad for the first RF signal) and one or more signal return pads 204, 206. FIG. 2A represents a typical prior art configuration, in which an appropriate terminating impedance 208 may be coupled between the signal pad 202 and a return pad 204 via a termination switch 210.

Figure 2B:
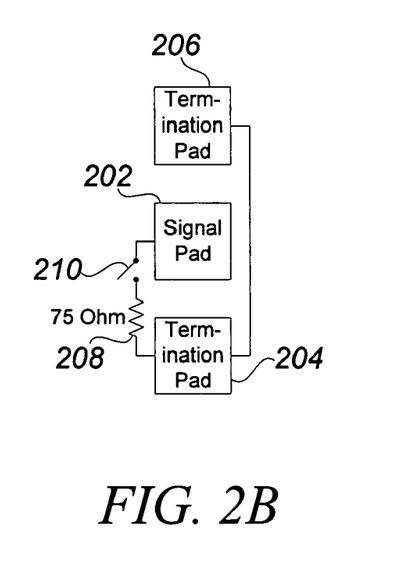

FIG. 2B is similar, except that a second return pad 206 is connected to the first return pad, and is disposed on roughly the opposite side of the signal pad 202 such that oppositely-directed return current loops may be created. The termination switch 210 and the terminating impedance 208 is shown to be configured as in FIG. 2A.

Figure 2C:
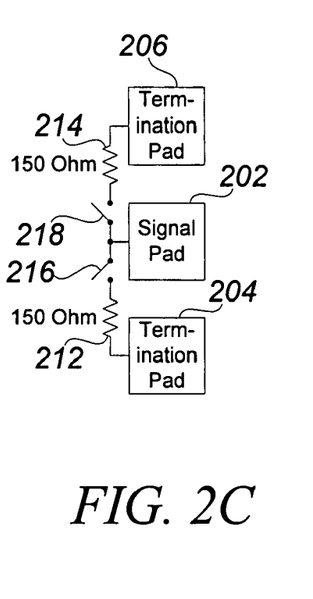

In FIG. 2C, two signal return pads 204 and 206 are again disposed on either side of the signal pad 202. FIG. 2C, however, includes separate terminating impedance elements 212 and 214 to control the current flow from the signal pad 202 to the signal return pads 204 and 206, respectively. In some situations, the two corresponding switches 216 and 218 may be employed for circuit layout convenience. However, the switches 216 and 218 are typically either both on or both off at any given time. Consequently, a single switch would suffice for this purpose if the layout permits. Because the signal return pads 204 and 206 are expected to be connected to the same potential, generally ground, in operation, the two 150 ohm impedance elements should be effectively in parallel to yield the same 75 ohm net terminating impedance as in FIGS. 2A and 2B.

Figure 2D:
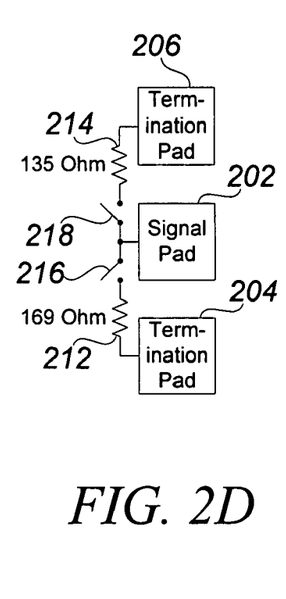

The physical and circuit layout represented by FIG. 2D is the same as for FIG. 2C, except that the two terminating impedance elements 212 and 214 have been made unequal, to 169 and 135 ohms, respectively. Other values will be selected as appropriate for particular embodiments to minimize coupling between the RF signal connected to the signal pad 202 and an isolation-target signal that is connected elsewhere on the IC. It may be useful to dispose the larger impedance element 212 in a return path that is physically closer to the signal pad of the isolation-target signal than is the other return path. Alternative or additional techniques may be used to minimize the magnetic mutual coupling between the RF signal and the isolation-target signal. For example, the net loop area for the closer signal return path may be made smaller, or may be made more orthogonal to the effective loop area of the isolation-target signal.

Figure 3:
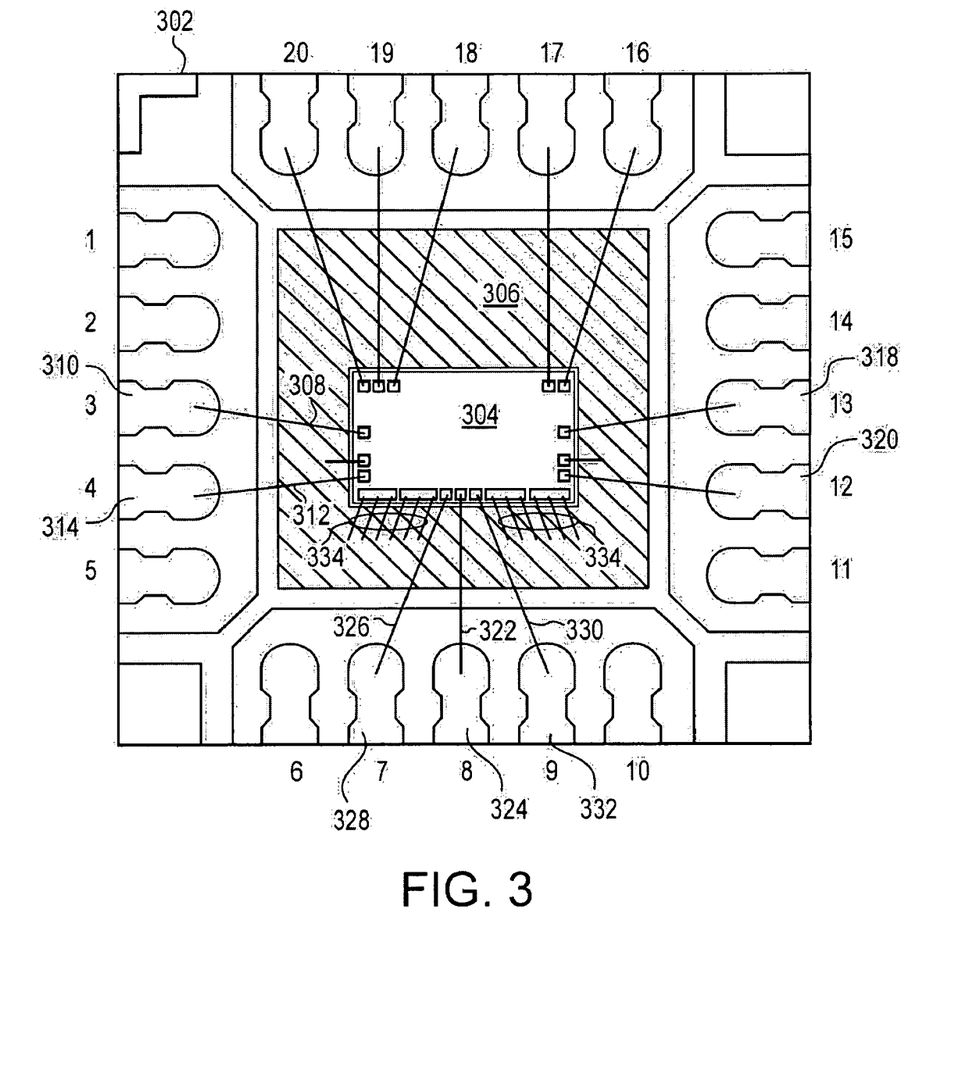
FIG. 3 illustrates an early IC/carrier interconnection configuration.

FIG. 3 illustrates features of connections between an exemplary IC carrier 302 and an IC die 304 mounted thereupon. This exemplary carrier includes a conductive plane area 306 of the carrier 302, upon which the IC 304 is physically attached, and twenty terminals, numbered 1-20, disposed about the perimeter of the carrier 302. In this older configuration, a bond wire 308 connects the first signal pad on the IC 304 to a first signal terminal #3 310. Another bond wire 312 connects a first signal return pad on the IC to a first signal return terminal #4 314. The second RF signal and return pads are similarly connected to a second signal terminal #13 318 and a second signal return terminal 320, respectively.

A bond wire 322 connects the RF common signal pad to an RF common signal terminal #8 324. For symmetry with the signal connections between which it is disposed, the RF common signal termination path is arranged in the manner shown in FIG. 2C. A bond wire 326 connects one of the signal common return pads to one signal common return terminal #7 328, and a bond wire 330 connects the other signal common return pad to another signal common return terminal #9 332. Again for symmetry, an equal number of bond wires 334 connect additional IC ground pads to the carrier ground plane 306 on each side of the signal common pad.

Figure 4:
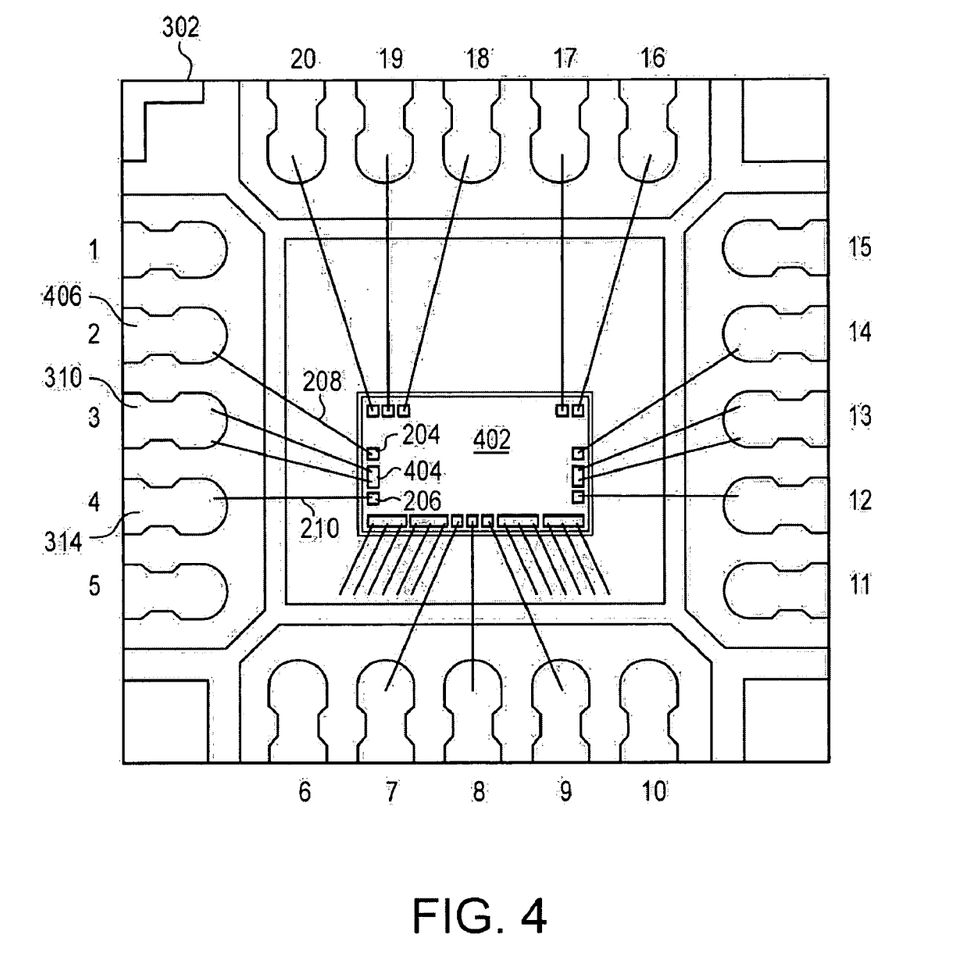
FIG. 4 illustrates a first alternative IC/carrier interconnection configuration.

FIG. 4 illustrates an IC die 402 disposed on an IC carrier 302 that is the same as shown in FIG. 3, including the ground plane 306 and twenty terminals #1-20. The IC die 402 differs from that of FIG. 3 in that the first RF signal connection has a double pad 404 that accommodates two bond wires that couple it to terminal #3 310. Moreover, the first signal termination path has been split in a manner as shown in FIG. 2B. The two first signal return pads 204 and 206 are coupled by bond wires 208 and 210 to first signal return terminals #2 406 and #4 314. The RF signal common connections are unchanged from FIG. 3, and the second signal connections mirror the first signal connections.

While the connection configuration described with respect to FIG. 4 employs a termination circuit as shown in FIG. 2B, the termination configurations of FIGS. 2C and 2D will serve better in some instances, providing more control over the mutual inductive coupling between a terminated RF signal (e.g., the first RF signal) and an isolation-target signal connection, such as the second RF signal connection or the RF common signal connection.

Figure 5:
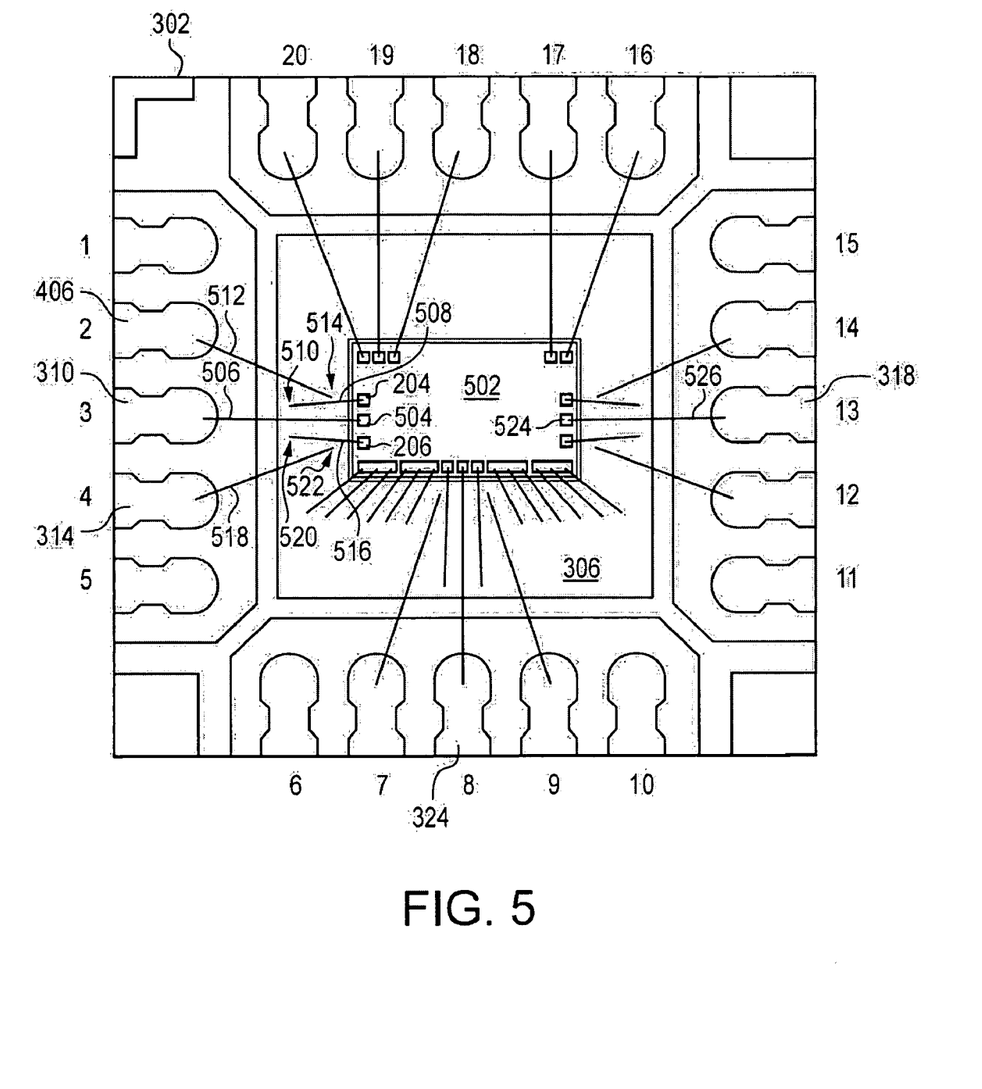
FIG. 5 illustrates a second alternative IC/carrier interconnection configuration.

FIG. 5 illustrates changes from the interconnections of FIGS. 3 and 4 that affect both magnetic coupling and capacitive coupling between a terminated RF signal connection and a target signal connection. First, the IC die 502 is modified so that the first RF signal connection pad 504 is singular, reducing the physical area of the signal connection and hence its capacitive coupling to other signals. Second, the first signal termination path is changed to use separate termination impedance elements for each path, as shown in FIGS. 2C and 2D, providing more control over magnetic coupling to other circuits. Third, the IC die 502 is disposed closer to the center of the IC carrier ground plane 306. This serves to make the first signal current path, when the first signal is terminated, more perpendicular to the isolation-target current path of the RF common signal, at least when the RF common signal is terminated. While the overall increase in size of the RFC termination loop may, in fact, increase coupling to that signal line, there will be a modest reduction in the area of the first and second RF signal termination-current loops. Indeed, the configuration of FIG. 5 may actually increase magnetic mutual coupling between the RF signal lines. As described below, minimum inductive coupling (or minimum capacitive coupling) between an RF signal line and an isolation-target signal line may not lead to the lowest net mutual coupling. In some instances, it may be useful to adjust one or the other of these quantities above the minimum that may readily be achieved.

IC dies disposed in IC packages or on IC carriers are often provided with a protective covering, such as a glass-filled epoxy, or are otherwise brought into close proximity with a material that has a higher dielectric constant than air. Such dielectric may (and usually does) increase capacitive coupling between signal connections. Certain connection configurations can be employed to reduce the capacitive coupling.

For example, as compared with FIG. 4, the bond wire 506 that connects the first RF signal to the first RF signal terminal #3 310 has been reduced in area by making it a single wire. As another example, each of the first signal return pads 204 and 206 are connected to their corresponding first signal return terminals by two bond wires. A first of these is a bond wire such as 508, which connects the first signal return pad 204 to the carrier ground plane 306 at a first connection point 510. A second of these is a bond wire such as 512 that connects the corresponding first signal terminal 406 to the carrier ground plane 306 at a second connection point 514. (Corresponding first and second bond wires 516 and 518 connect the other first signal return pad 206 to the corresponding first signal return terminal 314.) The two bond wires may each be made as long as possible, consistent with remaining close to the signal line, so that they provide a ground potential adjacent to, or above, the signal line. By interposing a ground potential between a portion of the field between the signal lines, the capacitive coupling may be reduced. That is, the ground plane connection points 510 and 520 of the first bond wires 508 and 516 are made distal from the IC die 502, significantly farther from the IC die 502 than are the connection points 514 and 522 of the second bond wires 512 and 518, so that the return path bond wires can function, in part, as shields to reduce capacitive coupling to an isolation-target signal line.

Further, the two bond wires may follow relatively closely to the first signal bond wire 506, whereby the loop area of both of the current paths for the terminated first signal may be reduced, thus reducing mutual inductance coupling to the isolation-target signal (for the terminated case). Moreover, the terminated first signal loops may be given a distinct major axis orientation that may be made orthogonal to a major axis orientation of an isolation-target pickup loop, further reducing the magnetic coupling. Finally, the two terminated first signal conduction loops may be made as nearly as possible symmetrically opposite, thereby canceling net magnetic flux due to the termination currents, which yet further minimizes inductive coupling.

After establishing minimum values for inductive and capacitive coupling that may readily be achieved by modifying the parameters noted above, it may be determined that further improvements may be made at particular frequencies of interest by tuning the capacitive and inductive coupling between signal connections. The net coupling can be nulled by tuning the mutual inductance (magnetic coupling) in combination with the mutual capacitance (capacitive coupling). The configuration details described above can be used to affect the values of both of these coupling types (magnetic and capacitive). Tradeoffs may then be made as necessary to obtain minimal mutual coupling over a very broad frequency range by minimizing the contribution of each type. Alternatively, mutual coupling may be reduced over a narrower frequency range by permitting a value of one or both mutual couplings to increase so as to obtain a coupling "null" at a frequency having a particularly stringent isolation requirement.

A second RF signal is connected from an IC pad 526 to the second signal terminal #13 318 via a bond wire 526. The second RF signal is typically an isolation target with respect to the first RF signal, and may have the same stringent isolation requirements with respect to the first RF signal as the first RF signal has with respect to the second RF signal. Both RF signals may also have stringent isolation requirements with respect to the RF common signal connected to the terminal #8 324. Accordingly, it will typically be useful to provide termination paths and connections for the second RF signal that are substantially similar to those provided for the first RF signal. In the embodiment represented in FIG. 5, however, perpendicularity of the major termination loop axes is only maintained between the first or second RF signals and the RF common signal. Minimizing magnetic coupling between the two terminated signal current paths may therefore rely more heavily on increasing separation distance, on reducing the area of the termination current paths, and on causing mutual flux cancellation by establishing oppositely-directed current flow in the plurality of termination current paths.

The termination current return paths for the RF common signal connected to terminal #8 324 may each be configured as dual bond wires in a manner similarly as set forth above in regard to the first RF signal. Compared to the IC die shown in FIG. 5, it may be necessary to move the IC die toward the RF common terminal #8 324 in order to minimize the net magnetic coupling of the terminated RF common signal to the terminated first RF signal and/or the terminated second RF signal.

In order to meet the isolation requirements with respect to the most stringent isolation target, tests may be performed using different impedance element values. Such tests can be performed in order to ascertain an optimum balance of termination current between the two termination current return paths.

Figure 6:
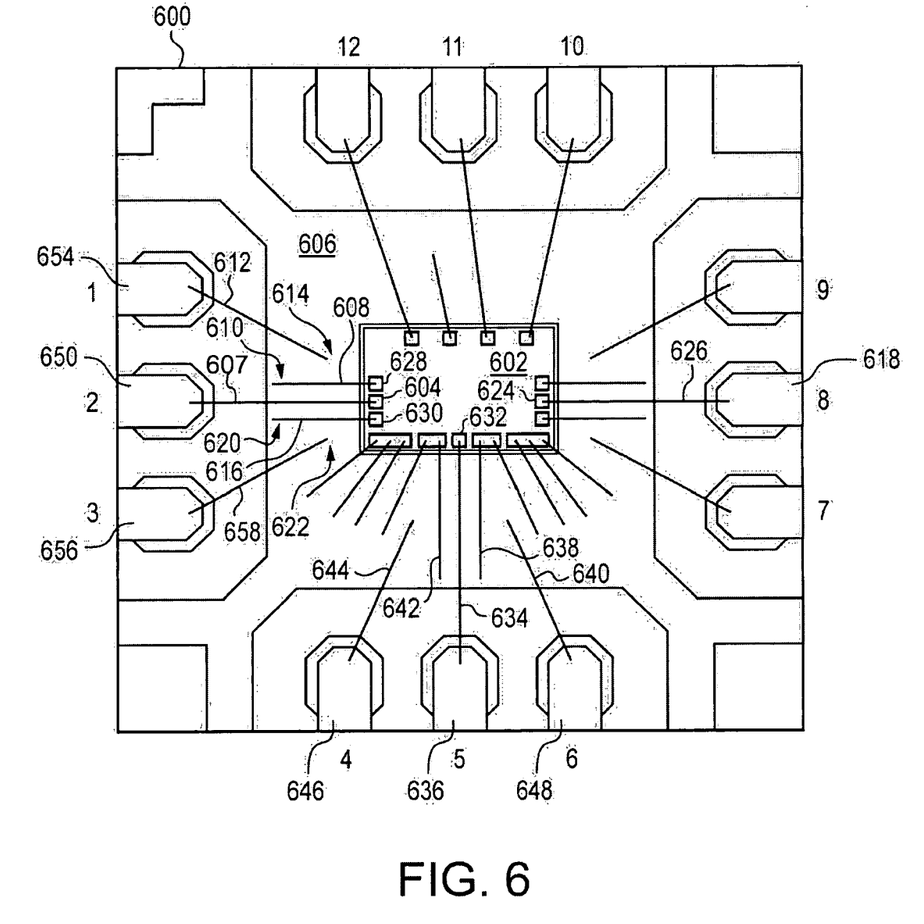
FIG. 6 illustrates a third alternative IC/carrier interconnection configuration.

FIG. 6 illustrates a generally similar connection scheme as described above with reference to FIG. 5. The IC die 602 and the carrier 600 of FIG. 6 are both smaller than those shown in FIG. 5, reducing distances and increasing most mutual signal couplings. A first signal terminal #2 650 is connected to a first signal IC pad 604 via a bond wire 607. First signal termination is provided as part of the IC die 602 in a configuration as shown in one of FIG. 2B, 2C or 2D. Two first signal return pads 628 and 630 are employed to establish two oppositely-directed termination current paths that divide the termination current entering the IC via the bond wire 607, such that the termination current returns via bond wires 608 and 616. The bond wires 608 and 616 are connected by metal paths to two first signal termination current return terminals 654 and 656. The metal paths may comprise single bond wires, but as shown in FIG. 6, each metal path comprises two bond wires (608 and 612, 616 and 658), as well as part of the ground plane 606.

The bond wires 608 and 616 are connected to the ground plane 606 at connection points 610 and 620, respectively, which are relatively far from the IC die so that the ground potential may run somewhat closely to and, insofar as possible, between the first signal wire 607 and a primary isolation-target signal wire. The primary isolation wire will typically be one of bond wires 626 (second RF signal connection) or 634 (RF common signal connection), to which the required isolation is most difficult to achieve. The bond wires 612 and 658 are connected to the ground plane 606 at points 614 and 622, respectively. In both FIG. 5 and FIG. 6, each of the four bond wires of the two first signal return paths are made long insofar as they can remain close to the corresponding first signal path, bond wire 607. In FIG. 6, because the angle from the return path terminals 654 and 656 is more acute than in FIG. 5, the bond wires 612 and 658 cannot readily remain close to bond wire 607. It may be useful to have them run relatively high from the ground plane, to provide more shielding and less capacitive coupling. Alternatively, it may be useful to shorten them such that connection points 614 and 622 approach connection points 610 and 620, respectively, to reduce return path loop area, thereby reducing magnetic coupling.

The second RF signal is connected from a terminal 618 to an IC pad 624. The IC includes a termination circuit configuration similarly selected from among FIGS. 2B, 2C and 2D, or any other comparable termination circuit that splits the termination return current at least two ways. The second signal termination return current is provided paths similar or symmetrical to those provided for the first signal termination return currents. It is possible to configure the connections for the second RF signal, and the second RF signal return, differently than for the first RF signal, but more commonly they will be configured similarly. The RF common connections will also typically be similarly configured, including both forward and return connection paths, as are the connections for the first RF signal. Variations may be made, however, in order to tune net coupling between the various signal lines in particular embodiments.

The RF common signal is connected from an RF common pad 632 to an RF common terminal 636 via a bond wire 634. When the RF common pad 632 is not connected to either of the first or second RF signals, RF common termination current arriving via the bond wire 634 is split and returned via metal paths to RF common termination current return terminals 646 and 648. As shown, the RF common return metal paths each include a plurality of path segments that are comparable to those of the first and second signal return paths. RF common return pads on the IC die 602 are connected via bond wires 638 and 642 to the carrier ground plane 606 at a point relatively distal from the IC die. Thereby, the bond wires 638 and 642, which are at ground or other AC common voltage, may help shield the RF common connection wire 634 and thereby reduce capacitive coupling. Portions of the carrier ground plane 606 form the next segment of the paths, followed by the bond wires 640 and 644 that complete the RF common termination return paths to the carrier terminals 648 and 646, respectively.

Figure 7:
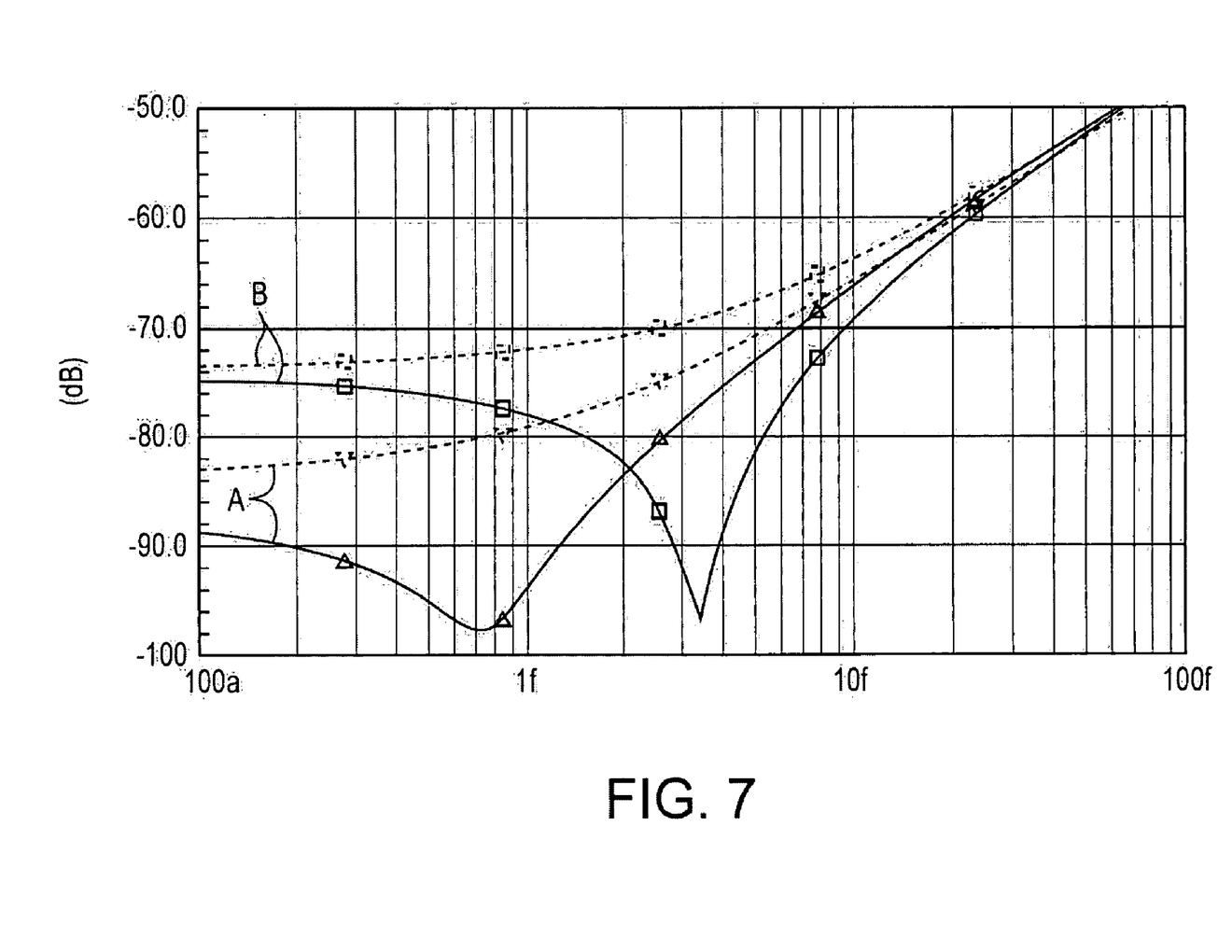
FIG. 7 is a graph illustrating interactions between quantities of mutual magnetic coupling and quantities of mutual capacitive coupling that are arranged to exist between signal lines to be isolated.

FIG. 7 illustrates simulated net isolation between a first signal line and an isolation target signal line (e.g., a second signal line, or an RF common signal line). The graphs reflect net isolation for exemplary connection configurations generally as shown in FIGS. 4 (lines "A") and 5 (lines "B"). Mutual magnetic coupling is held constant at a value expected from the particular configuration. Mutual capacitive coupling between the nominally isolated signal lines varies logarithmically along the "X" axis. In actual embodiments, the capacitance can be affected not only by the connection configuration details as noted above, but also by dielectric material (such as packaging plastic or sealing epoxy) that may be disposed nearby or between the nominally isolated signal lines. The net isolation in dB varies along the "Y" axis, with lower negative numbers indicating higher isolation. As may be seen from a review of FIG. 7, the configuration that provides the best net isolation depends upon the level of capacitive coupling that is presumed. Such capacitive coupling level presumption is limited by the net capacitive coupling that can be achieved.

The dotted lines (both A and B) illustrate isolation of the terminated first signal line to the RF common, while the solid lines illustrate isolation of the terminated first signal line to the second signal line when the second signal line is connected to the RF common line, and neither line is terminated. The solid lines indicate the more critical measurements. As may be seen, the coupling between the two signal lines has distinct complex interactions that result in "nulling" of the net mutual coupling. The nulling occurs at particular values of (simulated) capacitive coupling, because the frequency and mutual magnetic coupling are held constant. For values of total mutual capacitive coupling that are smaller than about 2 femtofarads, the solid line A indicates that a higher net isolation (lower net coupling) can be achieved with a configuration, such as that of FIG. 4, which is adjusted to provide lower mutual magnetic coupling. However, if the lowest capacitive coupling that can be achieved is approximately between about 2 and 5 femtofarads, the solid line B indicates that isolation of greater than −80 dB may be achievable by actually increasing the mutual magnetic coupling, in a circuit such as illustrated in FIG. 5.

Any of the individual steps described hereinabove may be used to adjust either the mutual capacitive coupling between the first signal and the isolation-target signal. The best net isolation may not necessarily be obtained by having the lowest possible value for each type of coupling. When a critical isolation requirement is most difficult to meet over a fairly narrow frequency range, it may be better to use the described steps to adjust at least one of capacitive or inductive mutual coupling to a value that is larger than may be readily achievable, so that the interaction of the two types yields a net isolation that is greater than either the inductive or capacitive mutual coupling, alone, would provide. In many embodiments, this method will include splitting termination return currents for both of the signals in a manner as described above.

CONCLUSION

The foregoing description illustrates exemplary implementations, and novel features, of a method of packaging and interconnecting integrated circuits to maintain high isolation between RF signal lines, and apparatus that can be configured to implement such method. The skilled person will understand that various omissions, substitutions, and changes in the form and details of the methods and apparatus illustrated may be made without departing from the scope of the invention. Numerous alternative implementations have been described, but it is impractical to list all embodiments explicitly. As such, each practical combination of the apparatus or method alternatives that are set forth above, and/or are shown in the attached figures, constitutes a distinct alternative embodiment of the subject apparatus or methods. Each practical combination of equivalents of such apparatus or method alternatives also constitutes a distinct alternative embodiment of the subject apparatus or methods. Therefore, the scope of the presented invention should be determined only by reference to the appended claims, as they may be amended during pendency of the application, and is not to be limited by features illustrated in the foregoing description except insofar as such limitation is recited, or intentionally implicated, in an appended claim.

All variations coming within the meaning and range of equivalency of the various claim elements are embraced within the scope of the corresponding claim. Each claim set forth below is intended to encompass any system or method that differs only insubstantially from the literal language of such claim, if such system or method is not an embodiment of the prior art. To this end, each described element in each claim should be construed as broadly as possible, and moreover should be understood to encompass any equivalent to such element insofar as possible without also encompassing the prior art.

What is claimed is:

1. A method of interconnecting a first signal ("S1") line from an external circuit to a corresponding S1 pad on an integrated circuit ("IC") die, wherein the S1 line is switchably connectable to a common signal ("Scom") line of the IC that is in turn switchably connectable to a second signal ("S2") line of the IC, and wherein the S1 line is terminated to a ground potential via a characteristic impedance while it is switchably decoupled from the Scom connection to the integrated circuit and is concurrently required to maintain at least 60 dB of isolation from a target signal ("S_target") line, the method comprising:
   a) connecting the S1 line from the S1 pad on the IC to an S1 connection terminal of the external circuit via an S1 metallic path;
   b) switchably coupling the S1 pad to a plurality of S1 return pads via corresponding S1 termination paths on the IC die that together approximately establish the characteristic impedance between the S1 pad and the S1 return pads, wherein the S1 return pads are disposed on opposite sides of the S1 pad and in operation will all be approximately at the ground potential; and
   c) connecting each of the plurality of S1 return pads to the external circuit via a corresponding S1 return metal path connected at one end to the S1 return pad and at an opposite end to a corresponding S1 return connection point, which in operation is coupled to the ground potential, such that a sum of currents of all S1 return metal paths is substantially equal to an S1 current that is conducted by the S1 metallic path.

2. The method of claim 1, further comprising disposing one or more impedance elements within the S1 termination paths to control distribution of the S1 current through the corresponding S1 return metal paths when, in operation, the S1 pad is decoupled from the Scom line and coupled to the plurality of S1 return pads.

3. The method of claim 1, wherein the S1 return pads are at a common voltage potential, further comprising disposing an extended ground potential plane at least adjacent to a first edge of the IC near the S1 pad, and wherein step (c) further comprises connecting each S1 return metal path to the ground potential plane at a corresponding S1 return plane connection point.

4. The method of claim 1, wherein
   d) the IC is controllable to switchably connect either an RF1 signal or an RF2 signal to a common RFC signal line;
   e) each of the RF1 and RF2 signal lines are configured in accordance with S1 of claim 1, wherein under certain conditions RF2 and/or RFC is S_target for RF1, while under other conditions RF1 and/or RFC is S_target for RF2;
   f) the RFC signal line is switchably terminated via a plurality of RFC return paths configured as are the S1 return paths of claim 1; and
   g) when the RFC signal line is connected to another signal line, neither such other signal line nor the RFC signal line is terminated via the corresponding terminating impedance on the IC.

5. The method of claim 2, further comprising disposing different values of impedance in different S1 termination paths such that in operation the return current through the different S1 return metal paths is unequal.

6. The method of claim 2, wherein the isolation requirement of the S1 is not higher with respect to any other terminal than with respect to a particular isolation-target signal ("S_target") connection, the method further comprising disposing a larger impedance in an S1 termination path connected to a first S1 return pad than the impedance in an S1 termination path connected to a second S1 return pad that is on the opposite side of the S1 pad and is farther than the first S1 return pad from the S_target line.

7. The method of claim 3, further comprising, for each S1 return plane connection point, connecting a secondary S1 return metal path from a corresponding secondary connection point of the ground potential plane nearby the S1 return plane connection point to a corresponding S1 return connection terminal that is disposed on an opposite side of the S1 connection terminal from a different second S1 return connection terminal.

8. The method of claim 6, further comprising providing S_target termination paths from an S_target pad to a plurality of S_target return pads that are disposed on opposite sides of the S_target pad and are each connected to the external circuit via a corresponding S_target return metal path.

9. The method of claim 7, wherein each S1 return plane connection point is farther from the IC die than is the corresponding secondary connection point of the ground potential plane.

10. The method of claim 6, further comprising, for each S1 return plane connection point, connecting a secondary S1 return metal path from a corresponding secondary connection point of the ground potential plane nearby the S1 return plane connection point but closer to the die, and thence to a corresponding S1 return connection terminal that is disposed on an opposite side of the S1 connection terminal from a different second S1 return connection terminal.

11. Apparatus including an integrated circuit ("IC") die and connections from the IC die to "off-board" circuit connection points that are not part of the IC die, the apparatus comprising:
 a) a first signal ("S1") pad that is disposed on the IC and is switchably connectable to a common signal ("Scom") pad also disposed on the IC, the Scom pad being further switchably connectable to a second signal pad disposed on the IC;
 b) an S1 metallic path connecting the S1 pad to an S1 connection terminal of the external circuit;
 c) a plurality of S1 return pads disposed on the IC die on different sides of the S1 pad and configured to be switchably coupled to the S1 pad via S1 termination paths when, in operation, the S1 pad is not coupled to the Scom pad; and
 d) a plurality of S1 return metal paths connected at one end to one of the S1 return pads and at an opposite end to an S1 return connection point, which in operation is coupled to the ground potential, such that a sum of currents of all S1 return metal paths is substantially equal to an S1 current that is conducted by the S1 metallic path.

12. The apparatus of claim 11, further comprising one or more termination impedance elements, disposed within the S1 termination paths, which substantially affect the S1 current when S1 is terminated.

13. The apparatus of claim 11, further comprising a ground potential plane disposed adjacent an edge of the IC closest to the S1 return pads, wherein each S1 return metal path includes a metal path disposed between the corresponding S1 return pad and a corresponding first connection point on the ground potential plane.

14. The apparatus of claim 12, further comprising distributing the termination impedance elements between different S1 termination paths to control a distribution of the return current through the different S1 return metal paths.

15. The apparatus of claim 13, wherein each S1 return metal path includes a further path disposed between a corresponding second connection point on the ground potential plane and the corresponding S1 return connection point.

16. The apparatus of claim 14, further comprising disposing differing termination impedance elements in different S1 termination paths to cause the return current through the different S1 return metal paths to be correspondingly different.

17. The apparatus of claim 15, wherein, for each of a plurality of S1 return metal paths adjacent to the S1 pad, the corresponding first connection point on the ground potential plane is farther from the IC than is the corresponding second connection point on the ground plane.

18. The apparatus of claim 16, further comprising an Scom metal path connected at one end to an Scom connection terminal of the external circuit and connected at an opposite end to the Scom pad of the IC such that the Scom metal path is closer to an S1 return metal path on one side of the S1 pad than to an S1 return metal path on a different side of the S1 pad, and wherein the different termination impedance elements are distributed to cause smaller return currents in the S1 return metal path closer to the Scom metal path than in the S1 return metal path on the different side of the S1 pad.

19. The apparatus of claim 18, further comprising providing Scom termination paths from the Scom pad to a plurality of Scom return pads that are disposed on opposite sides of the Scom pad and are each connected to the external circuit via a corresponding Scom return metal path.

20. The apparatus of claim 19, wherein a signal line RF1 is configured in accordance with S1, a signal line RFC is configured in accordance with Scom, the second signal pad to which the pad of Scom is switchably connectable is RF2, and RF2 is also configured in accordance with S1 of claim 1.

* * * * *